(12) United States Patent
Pohl

(10) Patent No.: US 7,726,553 B2
(45) Date of Patent: Jun. 1, 2010

(54) STAMPING DEVICE FOR GENERALLY FLAT ARTICLES

(75) Inventor: Gerhard Pohl, Albstadt (DE)

(73) Assignee: Groz-Beckert KG, Albstadt (DE)

( * ) Notice: Subject to any disclaimer, the term of this patent is extended or adjusted under 35 U.S.C. 154(b) by 839 days.

(21) Appl. No.: 10/870,534

(22) Filed: Jun. 18, 2004

(65) Prior Publication Data

US 2004/0261594 A1     Dec. 30, 2004

(30) Foreign Application Priority Data

Jun. 25, 2003   (DE) ................. 103 28 776

(51) Int. Cl.
  B21D 28/24    (2006.01)
  B26D 5/02     (2006.01)
  B26F 1/04     (2006.01)

(52) U.S. Cl. ............................. 234/43; 83/571; 83/620; 234/94; 234/120

(58) Field of Classification Search .................. 234/35, 234/45, 78, 97–101, 114, 115, 43, 44, 94, 234/120–122; 83/571, 618, 620, 622
See application file for complete search history.

(56) References Cited

U.S. PATENT DOCUMENTS

| 2,028,638 | A | * | 1/1936  | Woodruff et al. | 234/13 |
| 2,044,707 | A | * | 6/1936  | Lasker | 234/1 |
| 2,044,708 | A | * | 6/1936  | Lasker | 234/18 |
| RE20,720  | E | * | 5/1938  | Lasker | 234/18 |
| 2,124,178 | A | * | 7/1938  | Lasker | 234/44 |
| 3,137,441 | A | * | 6/1964  | Forsyth et al. | 234/78 |
| 3,170,390 | A | * | 2/1965  | Wagner | 234/35 X |
| 3,263,914 | A | * | 8/1966  | Huber | 234/45 X |
| 3,508,706 | A | * | 4/1970  | McInnis | 234/100 |
| 3,510,056 | A | * | 5/1970  | East et al. | 234/45 |
| 3,633,817 | A | * | 1/1972  | Edwards | 234/35 |
| 5,024,127 | A | * | 6/1991  | Mueller et al. | 83/13 |
| 5,144,872 | A | * | 9/1992  | Kakimoto | 234/114 X |
| 5,357,446 | A | * | 10/1994 | Maeda et al. | 700/160 |
| 6,991,714 | B1 | * | 1/2006  | Gauss et al. | 204/462 |

FOREIGN PATENT DOCUMENTS

DE        198 25 842       12/1999

* cited by examiner

*Primary Examiner*—Clark F. Dexter
(74) *Attorney, Agent, or Firm*—Fitch, Even, Tabin & Flannery; Norman N. Kunitz

(57) ABSTRACT

A stamping device, which in particular is arranged for stamping unfired ceramic substrates, has a die holder device with a plurality of dies, which for activation can be locked to the die holder device and then jointly with it execute an axial stamping motion. A coupling device which is remote-actuated is used for the locking. For the remote transmission of the actuation motion, a flexible mechanical connecting arrangement is used, such as preferably a cable.

14 Claims, 3 Drawing Sheets

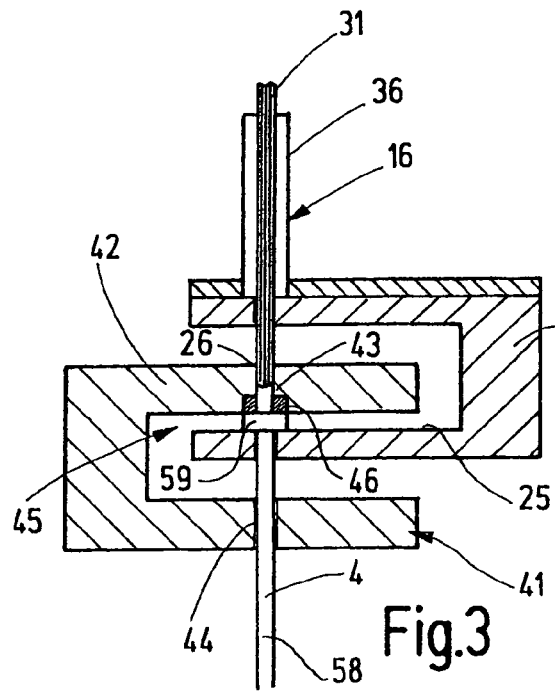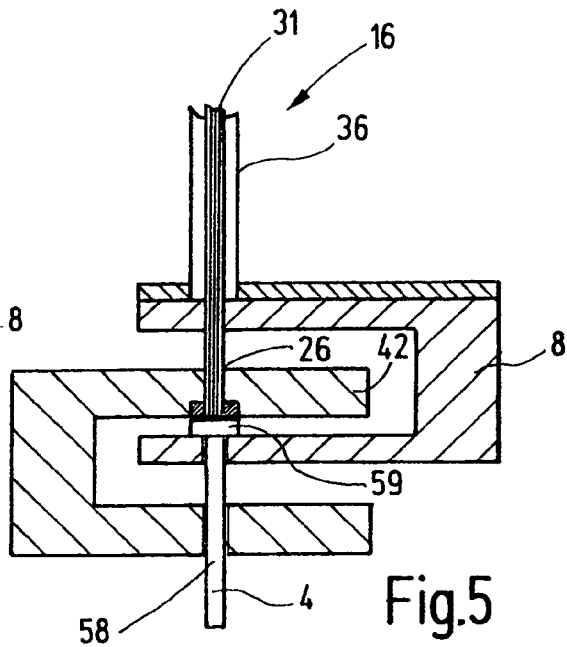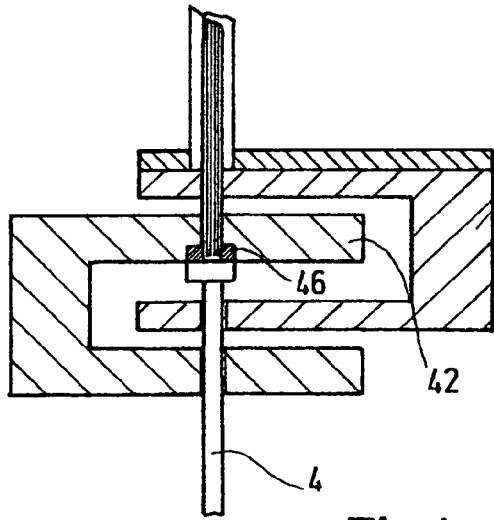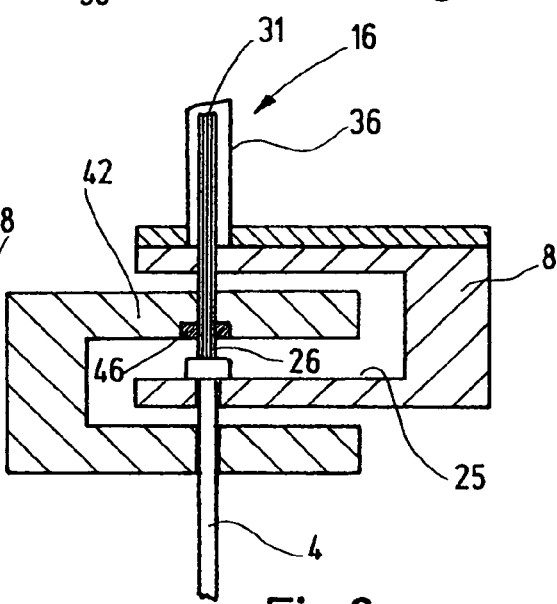

STAMPING DEVICE FOR GENERALLY FLAT ARTICLES

CROSS REFERENCE TO RELATED APPLICATIONS

This application claims the priority of German Patent Application No. 103 28 776.0, filed on Jun. 25, 2003, the subject matter of which, in its entirety, is incorporated herein by reference.

FIELD OF THE INVENTION

The invention relates to a stamping device which is arranged in particular for stamping unfired ceramic substrates, or so-called green sheets.

BACKGROUND OF THE INVENTION

Such green sheets, before being fired, must often be provided with a number of holes; the number and position of the holes, or in other words the hole pattern, must be changed from time to time or even from one piece to another. Tools with a plurality of movably supported dies are therefore known, of which only one selected group of dies at a time executes a stamping operation.

From U.S. Pat. No. 5,024,127, a stamping tool with a plurality of dies, each of which is assigned its own magnet coil drive mechanism, is known for the purpose. By supplying current to the respective magnet coil, the die connected to it is made to execute an axial motion and thus a stamping operation.

The installation space required for the coils defines a minimum die spacing of adjacent dies. This spacing cannot be made narrower arbitrarily. Moreover, such tools require cooling, because of the lost heat occurring in the coil drive mechanisms.

For stamping variable hole patterns in metal sheets, German Patent Disclosure DE 41 35 787 A1 discloses a stamping machining device that has a lower tool with a cutting plate and an upper tool with axially movably supported dies. The upper tool is secured to the tappet of a press and in operation executes a vertically reciprocating motion. Each die is assigned a locking bar, disposed above its head and supported movably transversely to it, which can lock the die in its axial position or release it. Each locking bar is connected to the piston rod of a separate pneumatic actuator, which is seated on the outside of the upper tool.

The attainable pitch spacings here are dependent on the size of the pneumatic actuators.

SUMMARY OF THE INVENTION

It is the object of the invention to create a stamping device which as needed can create different hole patterns in a generally flat workpiece, which is simple in construction and functions reliably, and which has close pitch spacings of the hole stamping tools.

This object is generally attained according to the invention with a stamping device, in particular for stamping green sheets, comprising: a die holder device, which is connected to a drive mechanism in order to execute a stamping motion; a plurality of dies, which are retained axially movably relative to the die holder device; a controllable coupling device, which is arranged to connect the dies axially fixedly to the die holder device; a control unit, which is disposed remote from the die holder device and has outputs for actuating the coupling device, with which the dies are activatable and deactivatable; and, a flexible mechanical connecting means, which is disposed between the control unit and the coupling device in order to connect them mechanically to one another.

The stamping device of the invention has a die holder device, with dies retained axially movably on it; the dies can be axially locked to the holder device by means of a coupling device. The coupling device is connected to a control unit via a flexible mechanical connecting means, and as a result the individual dies can be locked to or released from the die holding device by remote actuation. The flexible connecting means decouples the dies, or the coupling device assigned to them, and the control unit three-dimensionally. The control unit may be disposed in stationary fashion and have quite different dimensions from the dies and the associated coupling device. The pitch and arrangement of the drive mechanisms of the control unit need not match the pitch and arrangement of the dies, either. The connections toward the dies of the flexible connecting means can for instance be much closer together, that is, in closer spacing, than the outputs of the control unit to which the other end of the flexible connecting means is connected. For actuating the coupling device, relatively large actuators can therefore be used, yet especially slight lateral die spacings nevertheless become possible.

A further substantial advantage, resulting from the spatial separation of the mechanical control unit and the coupling device, is the reduction in masses in motion in the stamping device. This has advantages, especially at very high stroke rates per minute. The machining time for individual green sheets can be reduced.

A further substantial advantage that results from the spatial separation of the control unit from the coupling device is that heat input into the moving part of the stamping device by the control unit is eliminated. If for instance the control unit contains magnet coils or other devices through which current flows, such as valves or the like, then the heating up of these elements has no effect on the actual stamping tool.

It is furthermore possible to optimize the mechanical actuators of the control unit with a view to their reaction time. When the size and shape of the actuators and the control elements assigned to them are defined, there is no need to take the space available at the stamping tool into account.

The stamping device preferably has a retainer for firmly retaining deactivated dies in their deactivation position. This retainer can be formed for instance by spring means that keep the dies in a raised retraction position, or by magnets that connect the deactivated dies releasably to a holder. Alternatively, correspondingly functioning coupler means may be provided.

In order to move the dies that are to be activated axially in a stamping stroke, the coupling device, for each die, has one coupling element, which is supported movably relative to the die holder device and is movable via the flexible connecting means. The coupling element can for instance be movably supported lengthwise to the die and can thus transmit the stamping force to the die. This design requires especially little lateral installation space and thus makes especially fine pitch spacings possible. It is furthermore possible to move the coupling element transversely to the die, so that the adjusting force of the coupling element is independent of the stamping force to be brought to bear. This design is especially suitable for more-difficult stamping jobs.

The flexible connecting means preferably has at least one cable device, which is sometimes also called a Bowden cable. It includes a flexible, relatively kink-resistant core in a flexible sleeve. The core is axially movably supported in the sleeve and is formed for instance by a spring steel wire. The sleeve is preferably formed by a flexible steel pipe. The coupling element can, particularly in the axial design in which the coupling element is moved axially to the die, be formed by a free end of the core. This design makes especially fast switchover operations possible and moreover has the advantage that switching the die from active to passive or vice versa need not necessarily be concluded at top dead center of the die holder device. Instead, the coupling element is capable of forcing the die off the coupler means even if the die holder device has already left top dead center.

The control unit preferably has pneumatic actuators. They can be formed by balls, which are supported in chambers and which like pistons in a pneumatic cylinder are moved toward a tappet by compressed air. The tappet motion can be transmitted to the coupling device via the flexible connecting means. Alternatively, it is possible to transmit not only the switchover motion of the coupling device but also the stamping motion from a pneumatic actuator to the die. In this embodiment, the full power to be exerted for accelerating the die should be transmitted from the flexible connecting means. It is therefore preferable to connect the die holder device with a linear drive mechanism, such as one or more eccentric drive mechanisms, linear motors, cam drives, or the like, so that the power of all the dies that is required for the stamping originates in a single drive mechanism, connected directly to the die holder device.

Further advantageous embodiments of the invention will become apparent from the drawing, the description, or the dependent claims.

BRIEF DESCRIPTION OF THE DRAWINGS

One exemplary embodiment of the invention is shown in the drawing. Shown are:

FIGS. 3 through 6, in sectional views, the stamping device of FIGS. 1 and 2 in various working positions.

DETAILED DESCRIPTION OF THE DRAWINGS

Figure 1:
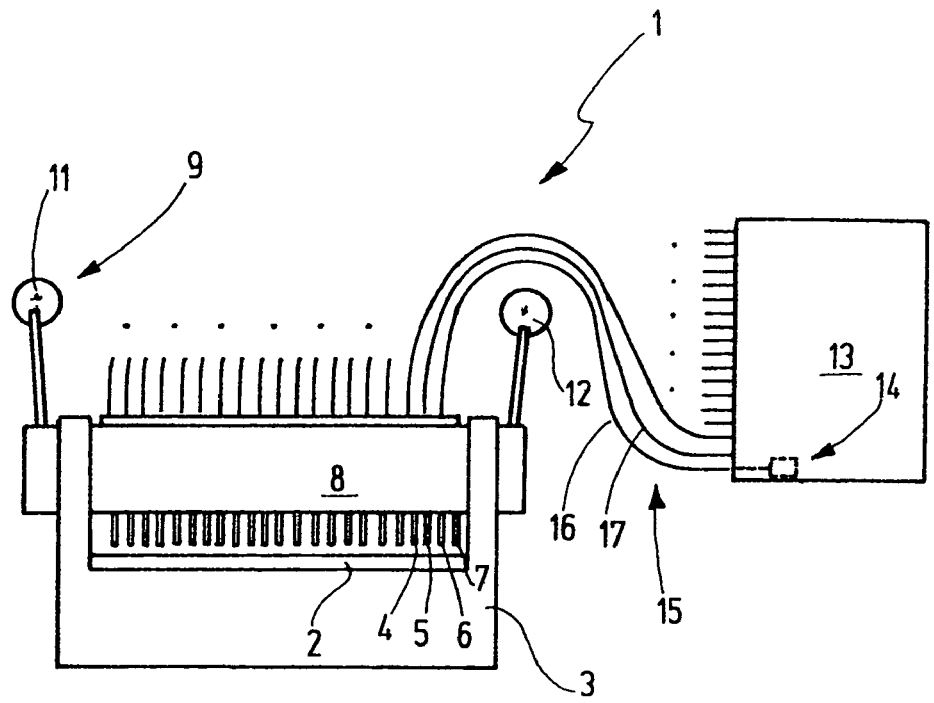
FIG. 1, in a schematic block diagram, a stamping device.

In FIG. 1, a stamping device 1 is shown, which can be used to stamp green sheets. It includes a cutting plate 2, which is retained on a frame 3 and forms a lower tool. The cutting plate 2 is used for supporting the green sheets, which are not further shown, and has an entire group of cutting holes that are assigned to dies 4, 5, 6, 7. The dies 4 through 7, and other dies not identified by reference numerals, are retained on a die holder device 8 that is shown schematically in FIG. 1. This device, with the dies, forms an upper tool, which is guided vertically displaceably on the frame 3. For stamping the green sheets, the die holder device 8 executes a vertical motion, which causes the dies 4 through 7, at least if they are active, to plunge periodically into the respective cutting holes assigned to them. For driving the die holder device, a drive mechanism 9 is used, which is formed in FIG. 1 by two eccentric drive mechanisms 11, 12, which are connected to the die holder device 8 via connecting rods.

Figure 2:
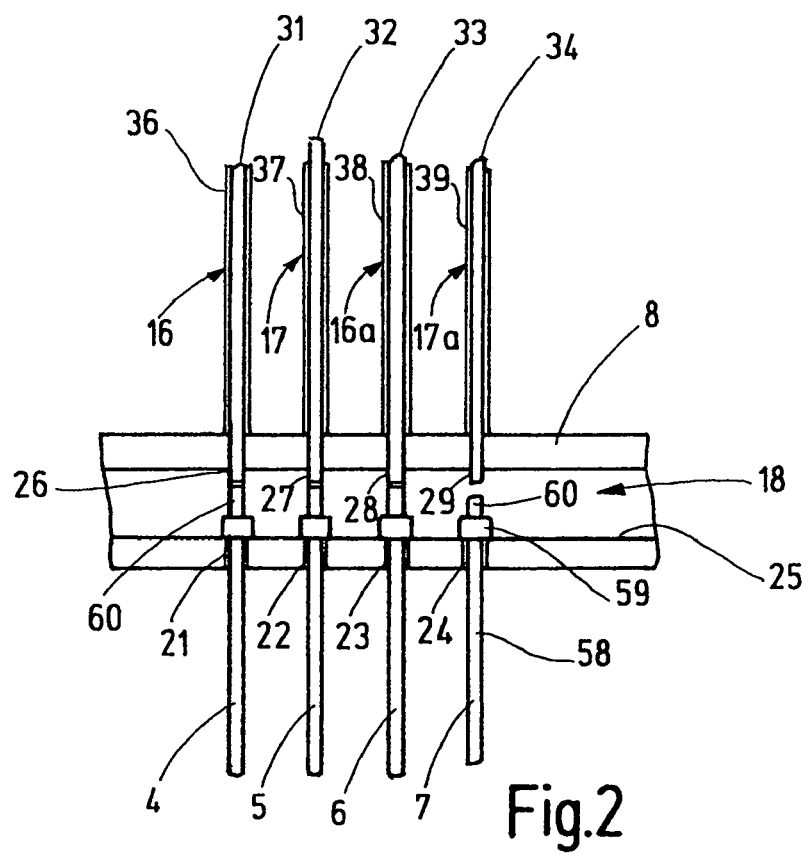
FIG. 2, in a fragmentary schematic view, the stamping device of FIG. 1.

For selectively activating or deactivating dies, a control unit 13 is used, which contains individual actuators 14. The outputs of these actuators, as can be seen from FIG. 2, are connected to a coupling device 18 via a flexible mechanical connecting means 15, for instance in the form of cables 16, 17. The dies 4, 5, 6, 7 are axially displaceably supported in one or more rows next to one another in the die holder device 8 in corresponding guide bores 21 through 24. The dies 4, 5, 6, 7 comprise a cylindrical shaft part 58, surrounded in its upper region by an annular bush 59 which forms the die head. The die head 59, in this exemplary embodiment, is spaced apart from the end of the die shaft 58, so that a second die guiding portion 60 exists. The bush 59 and the die shaft 58 are joined together in a conventional way, for instance by soldering. Integrally formed dies can also be contemplated. It is also possible for the bush 59 to be flush with the end of the die shaft, and in that case the second guiding portion 60 is not present. FIGS. 3 through 6 show an exemplary embodiment of this kind. This is no restriction to the concept of the invention. With their heads 59, the dies 4, 5, 6, 7 rest on a substantially flat contact face 25 of the die holder device 8 which is otherwise U-shaped in cross section (see also FIG. 3). A coupling device 18, which couples the dies 4, 5, 6 and 7 to the die holder 8 for reciprocation therewith, includes coupling elements 26, 27, 28, 29, which are each individually assigned to the respective dies 4, 5, 6, 7. The coupling elements 26 through 29 are supported axially movably, so that they can press the heads 59 of the dies 4 through 7 against the contact face 25 or release them. For illustration purposes, the coupling element 29 is shown in such a release position. The coupling elements 26 through 29 can be formed by the ends of cores 31, 32, 33, 34, which belong to the cables 16, 17, 16a, 17a. The ends of these cores 31 through 34 are disposed coaxially to the dies 4 through 7 and extend through corresponding bores in an upper leg of the die holder device 8. Also secured to this leg are sleeves 36 through 39 of the cables 16 through 17a.

FIG. 3 shows the cable 16 and the die 4 in cross section, to represent all the other dies and cables. Also visible in FIG. 3 is a retainer 41, which has a holder 42 supported in stationary fashion, for instance in the form of an upper leg of a U-shaped profile section. For each coupling element 26 through 29, the holder 42 has one guide bore 43, in which the applicable coupling element 26 is retained axially displaceably. The guide bore 43 is aligned with the die 4. The holder 42 engages an interstice between the two legs of the U-profile-shaped die holder device 8, and the vertical mobility of the holder 42 is greater than the stamping stroke that the die holder device 8 executes.

The retainer 41 embodied in the form of a U-profile section can also have a lower leg, which for both the die 4 and for every other die is provided with a respective bore 44 through which the die shaft 58 of the die 4 extends.

The die 4 is engaged preferably by a decoupler device 45 for decoupling the die 4 from the die holder device 8 to permit relative movement between the die 4 and the die holder device 8, which retains the die 4 resiliently in its upper, raised position shown in FIG. 3. The decoupler device 45 can be formed for instance by a spring (not shown) braced between the lower die holder device 8 and the die head 59, or as shown in FIG. 3, by a permanent magnet 46, which for instance as a ring magnet is disposed concentrically to the guide bore 43. The permanent magnet 46 acts on the head of the die 4 in such a way that the die adheres to it.

Figure 7:
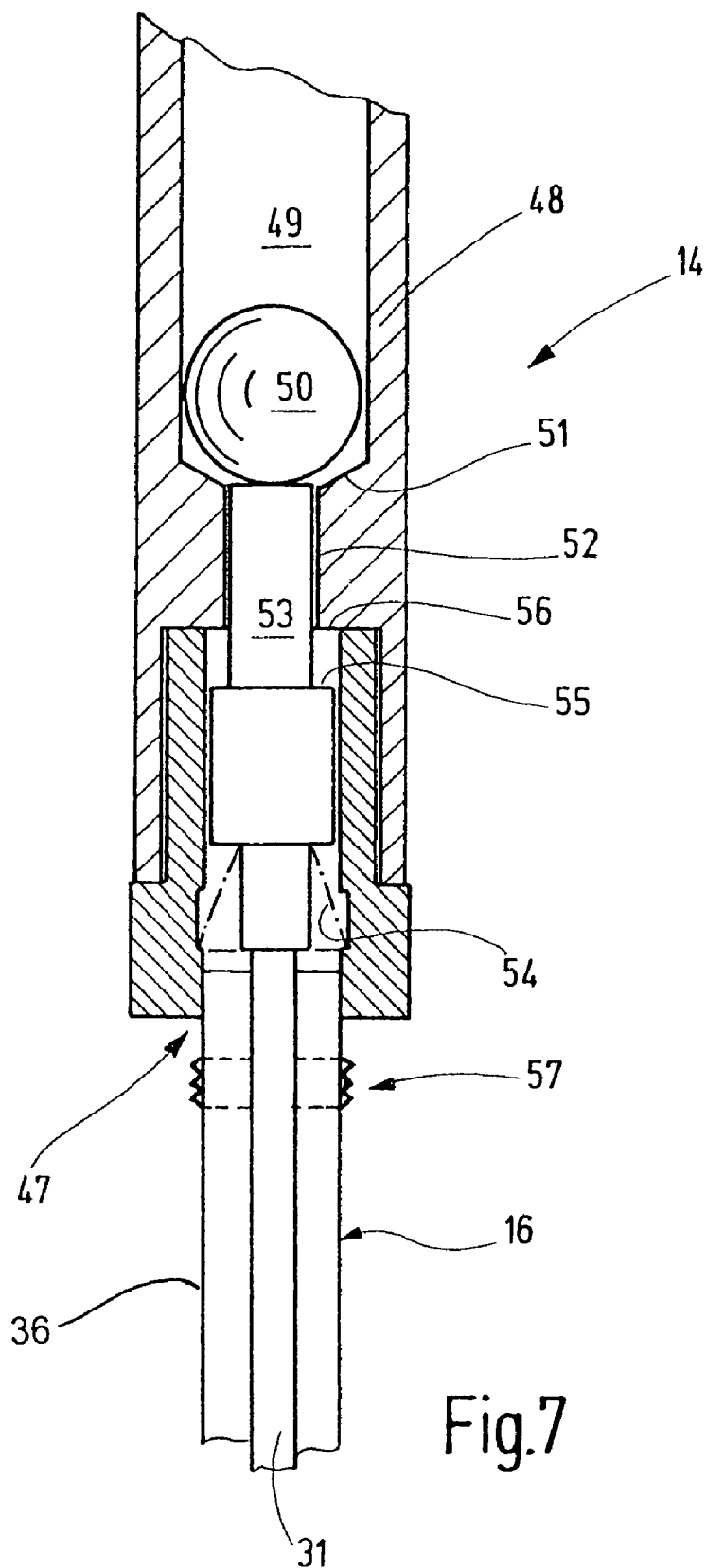
FIG. 7, in a schematic sectional view, a pneumatic actuator of the control unit of the stamping device of FIG. 1.

FIG. 7 shows the pneumatic actuator 14, representing all the actuators of the control unit 13. The cable 16 is connected to its output 47. The actuator 14 is formed by a tubular main body 48, in which an approximately cylindrical inner chamber 49 is embodied. On the face end, this chamber is closed off by a conical seat 51. A ball 50, whose diameter is slightly smaller than that of the inner chamber 49, is disposed in the interior or chamber 49. Centrally and coaxially with the inner chamber 49, the seat 51 merges with a cylindrical bore 52, through which a tappet 53 protrudes. The tappet 53 is axially displaceably supported in the bore 52. On its end remote from the ball 50, it is joined to the core 31. A compression spring 54 engaging the tappet 53 presses the tappet in the direction of the ball 50, until a shoulder 55 provided on it rests on an annular counterpart contact face 56 that surrounds the bore 52. Electrically controlled valves, not further shown, are connected to the chamber 49 in order to supply the chamber 49 with compressed air and ventilate it again in a purposeful way.

The stamping device 1 described thus far functions as follows:

In operation, the drive mechanism or linear drive 9 periodically moves the die holder device 8 up and down, and as a result the dies stamp a green sheet placed on the cutting plate 2. Only active dies are operative in this process; non-active dies do not participate in it. The activation and deactivation of individual dies is done in detail by the control unit 13 as follows:

The control unit 13 controls the activation and deactivation of individual dies via the flexible connecting means 15. This is done by advancing or retracting the cores 31 through 34 of the individual cables 15, 16, 16a, 17, 17a. FIGS. 3 through 6 explain this taking the die 4 as an example.

In FIG. 3, the die holder device 8 is shown at top dead center, and in FIG. 4 it is shown during the downward stroke or just before bottom dead center. The die 4 in this example is inactive. The associated actuator 14 is vented. The spring 54 (FIG. 7) presses the tappet as a result into its passive position, in which the shoulder 55 rests on the counterpart contact face 56. The core 31 of the cable 16 is thereby transferred to a retracted position, in which as in FIG. 3 it does not rest on the end of the shaft of the die 4. It is also possible for the core 31 to touch the end of the die shaft; in that case, the contact is free of force transmission. If the die holder device 8 now moves downward, as shown in FIG. 4, the die head 59 stays in the upper position, held by the permanent magnet 46; that is, the die 4 is not moved downward, nor does it take a seat on the green sheet. The die holder device 8 can execute an arbitrary number of strokes without moving the die 4.

If the die 4 is to be activated, the actuator 14 assigned to it is subjected to compressed air. The ball 50 is pressed within milliseconds against the end face of the tappet 53 and pushes the tappet axially in front of it, until the ball rests on the seat 51. In the process, the relatively inflexible spring wire that forms the core 31 is transferred to the position shown in FIG. 5. This preferably occurs when the die holder device 8 is at or in the vicinity of top dead center.

The coupling element 26 is as a result, as FIG. 5 shows, made to approach the end of the die shaft, or presses against it. If as FIG. 6 shows the die holder device 8 is now moved toward the holder 42 in the axial direction of the die 4, in the direction of bottom dead center, the coupling element 26 presses the head 59 of the die 4 away from the permanent magnet 46.

The distance that the ball 50 has moved the tappet 53 matches the distance by which the coupling element 26 has been advanced in the direction of the head of the die 4. Because in its downward motion the die holder device 8 carries the sleeve 36 of the cable 16 along with it, the core 31 executes this downward motion as well, so that the coupling element 26 also continues to keep the head 59 of the die 4 pressed firmly against the contact face 25. The die 4 is thus active, and it remains so as long as the ball 50 is pressed against the seat 51.

To make it possible to compensate for longitudinal tolerances, the sleeve 36, as FIG. 7 shows, may be provided with a compression spring element 57 or secured to a resiliently supported holder. This is especially advantageous if the stroke to be traversed by the ball 50 is somewhat longer than the distance required to press the coupling element 26 against the end of the shaft of the die 4. The compression spring element 57 then prestresses the coupling element 26 resiliently against the end of the die shaft and thus prestresses the die head 59 against the contact face 25.

The switchover of the various dies 4, 5, 6, 7 between their active working position and their passive position is accomplished within only a few milliseconds. The core 31 is rigid in its longitudinal direction and is supported with little friction in the flexible steel pipe that the sleeve 36 forms. The space required laterally is not much greater than the width of one die head 59, so that very close spacings can be attained. Heat input into the actual stamping device (die and die holder device) cannot be demonstrated. Either pneumatic actuators 14 or other kinds of actuators 14, such as electrodynamic, electromagnetic, or similar actuators 14, may be used.

A stamping device 1, which in particular is arranged for stamping unfired ceramic substrates, has a die holder device 8 with a plurality of dies 4, 5, 6, 7, which for activation can be locked to the die holder device 8 and then jointly with it execute an axial stamping motion. A coupling device 18 which is remote-actuated is used for the locking. For the remote transmission of the actuation motion, a flexible mechanical connecting means is used, such as preferably a cable 16.

List of Reference Numerals

1 Stamping device
2 Cutting plate
3 Frame
4, 5, 6, 7 Die
8 Die holder device
9 Drive mechanism
11, 12 Eccentric drive mechanisms
13 Control unit
14 Actuators
15 Connecting means
16a, 17, 17a Cables
18 Coupling device
21, 22, 23, 24 Guide bore
25 Contact face
26, 27, 28, 29 coupling elements
31, 32, 33, 34 Cores
36, 37, 38, 39 Sleeves
41 Retainer
42 holder
43 Guide bore
44 Bore
45 Decoupler device
46 Permanent magnet
47 Output
48 Main body
49 Inner chamber
50 Ball
51 Seat
52 Bore
53 Tappet
54 Compression spring
55 Shoulder
56 Counterpart contact face
57 Compression spring element
58 Die shaft
59 Head
60 Guiding portion

The invention claimed is:

1. A stamping device, in particular for stamping green sheets, comprising:

a die holder device, which is connected to a drive mechanism that reciprocates the die holder device in order to execute a stamping motion;

a plurality of dies, which are retained axially movably relative to the die holder device, the dies each having a first end for engagement with a work piece and a second end;

a controllable coupling device, which is mounted on the die holder device and is arranged to couple the dies axially fixedly to the die holder device, the coupling device having coupling elements, each coupling element for coupling one of the dies to the die holder device, wherein each coupling element is supported on the die holder device both for movement with the die holder device during reciprocation of the die holder device, and for movement relative to the die holder device and in the axial direction of the associated die to couple and uncouple the associated die;

a control unit, which is disposed remote from the die holder device and has outputs for actuating the coupling device, with which the dies are activatable and deactivatable; and, a flexible mechanical connecting means, which is disposed between the control unit outputs and the coupling device in order to connect them mechanically to one another, with the coupling elements being connected to and moveable by the connecting means.

2. The stamping device of claim 1, wherein the dies are coupled to a retainer for firmly retaining the deactivated dies.

3. The stamping device of claim 2, wherein the retainer has a holder as well as a decoupler device, wherein the decoupler device is disposed operatively between the dies and the holder.

4. The stamping device of claim 3, wherein the decoupler device includes a magnet.

5. The stamping device of claim 1, wherein the coupling element is driveably connected to the connecting means.

6. The stamping device of claim 5, wherein the connecting means has at least one cable device with a core and a sleeve, and the core of the cable device has one end that forms the coupling element.

7. The stamping device of claim 5, wherein the connecting means has at least one cable device with a core and a sleeve, and the sleeve of the cable device is connected to the die holder device.

8. The stamping device of claim 1, wherein the connecting means has at least one cable device with a core and a sleeve.

9. The stamping device of claim 8, wherein the core of the cable device is a wire.

10. The stamping device of claim 8, wherein the sleeve of the cable device is a flexible steel pipe.

11. The stamping device of claim 1, wherein the control unit has pneumatic actuators, which are each connected to the outputs of the control unit.

12. The stamping device of claim 11, wherein each pneumatic actuator is formed by a ball supported in a chamber that can be acted upon by air.

13. The stamping device of claim 1, wherein each die is associated with a respective one of the coupling elements.

14. The stamping device of claim 13, wherein each coupling element is supported for coaxial movement with its associated die.

* * * * *